(12) United States Patent
Sundararajan et al.

(10) Patent No.: US 8,589,318 B2
(45) Date of Patent: Nov. 19, 2013

(54) LOCATION DETERMINATION USING GENERALIZED FINGERPRINTING

(75) Inventors: Arjun Sundararajan, Redmond, WA (US); Jyh-Han Lin, Mercer Island, WA (US)

(73) Assignee: Microsoft Corporation, Redmond, WA (US)

( * ) Notice: Subject to any disclaimer, the term of this patent is extended or adjusted under 35 U.S.C. 154(b) by 234 days.

(21) Appl. No.: 13/183,464

(22) Filed: Jul. 15, 2011

(65) Prior Publication Data

US 2013/0018826 A1    Jan. 17, 2013

(51) Int. Cl.
G06F 15/18        (2006.01)
G06F 7/60         (2006.01)
G06N 99/00        (2010.01)
G06F 17/50        (2006.01)

(52) U.S. Cl.
CPC .......... *G06N 99/005* (2013.01); *G06F 17/5018* (2013.01)
USPC ................................................ 706/12; 703/2

(58) Field of Classification Search
None
See application file for complete search history.

(56) References Cited

U.S. PATENT DOCUMENTS

| | | | |
|---|---|---|---|
| 7,167,714 B2 | 1/2007 | Dressler et al. | |
| 7,312,752 B2 | 12/2007 | Smith et al. | |
| 7,538,715 B2 | 5/2009 | Langford et al. | |
| 7,630,943 B2 | 12/2009 | Nerguizian et al. | |
| 8,311,018 B2 * | 11/2012 | Carlson et al. | 370/336 |
| 2010/0109842 A1 * | 5/2010 | Patel et al. | 340/10.1 |

OTHER PUBLICATIONS

Ledlie, Jonathan, "Simple, On-Device Positioning using Compressed Fingerprint Archives", Retrieved at <<http://research.nokia.com/files/tr/NRC-TR-2010-002.pdf>>, Jul. 20, 2010, pp. 9.

Kuo, et al., "Discriminant Minimization Search for Large-Scale RF-Based Localization Systems", Retrieved at <<http://ieeexplore.ieee.org/stamp/stamp.jsp?arnumber=05453380>>, IEEE Transactions on Mobile Computing, vol. 10, No. 2, Feb. 2011, pp. 291-304.

Yin, et al., "Learning Adaptive Temporal Radio Maps for Signal-Strength-Based Location Estimation", Retrieved at <<http://www.inrg.csie.ntu.edu.tw/web2008/paper/2010_spring/Learning%20Adaptive%20Temporal%20Radio%20Maps%20for%20Signal-Strength-Based%20Location%20Estimation.pdf>>, IEEE Transactions on Mobile Computing, vol. 7, No. 7, Jul. 2008, pp. 869-883.

Swangmuang, et al., "Location Fingerprint Analyses Toward Efficient Indoor Positioning", Retrieved at <<http://ieeexplore.ieee.org/stamp/stamp.jsp?tp=&arnumber=4517383>>, Sixth Annual IEEE International Conference on Pervasive Computing and Communications, Mar. 17-21, 2008, pp. 100-109.

\* cited by examiner

*Primary Examiner* — Alan Chen
(74) *Attorney, Agent, or Firm* — Microsoft Corporation

(57) ABSTRACT

An RF fingerprinting methodology is generalized to include non-RF related factors. For each fingerprinted tile, there is an associated distance function between two fingerprints (the training fingerprint and the test fingerprint) from within that tile which may be a linear or non-linear combination of the deltas between multiple factors of the two fingerprints. The distance function for each tile is derived from a training dataset corresponding to that specific tile, and optimized to minimize the total difference between real distances and predicted distances. Upon receipt of an inference request, a result is derived from a combination of the fingerprints from the training dataset having the least distance per application of the distance function. Likely error for the tile is also determined to ascertain whether to rely on other location methods.

20 Claims, 9 Drawing Sheets

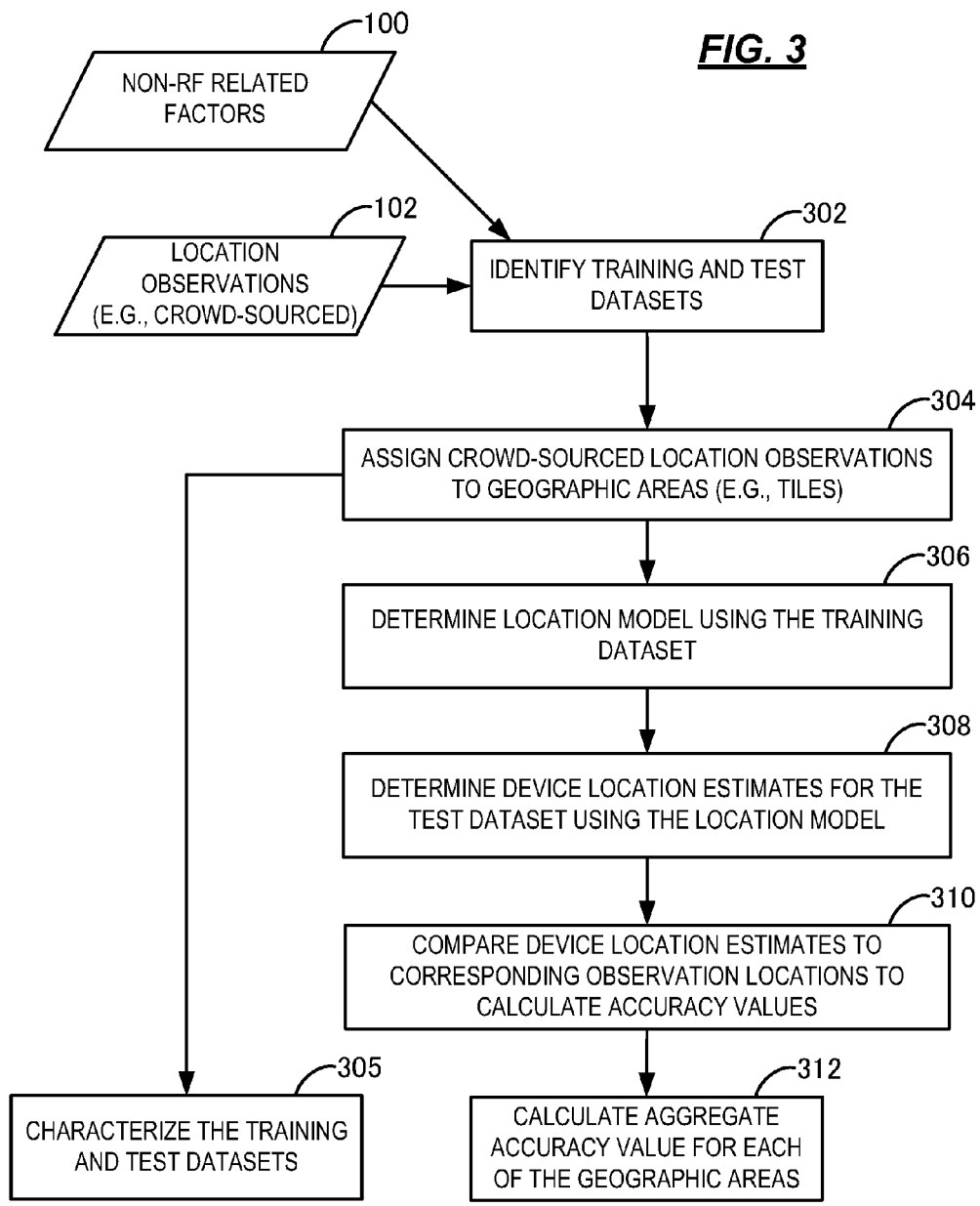

LOCATION DETERMINATION USING GENERALIZED FINGERPRINTING

BACKGROUND

Wi-Fi positioning system (WPS) can provide position in certain situations (such as indoors) by taking advantage of the rapid growth of wireless access points (WAPs) in urban areas. A provider of this type of service maintains a public database and can determine the position for a device based on the specific access points accessible from the device in each specific location. The localization technique used for positioning with wireless access points is based on measuring the intensity of the received signal (Received Signal Strength or "RSS") to more uniquely identify each location (usually arranged in a grid comprising a plurality of tiles) using RF fingerprint locating methodologies (hereinafter referred to as "fingerprinting"). Naturally, the accuracy of such approaches depends on the number of positions that have been entered into the database. The possible signal fluctuations that may occur, however, can increase errors and inaccuracies in the path of the user. To minimize fluctuations in the received signal, certain techniques can be applied to filter this kind of "noise."

However, in practical applications, conventional fingerprinting approaches are difficult to scale and implement. For example, conventional approaches rarely make effective use of crowd-sourced-only data and thus often require labor-intensive calibration in the local environment. Moreover, such approaches generally do not make of use of non-RF related information that may help improve performance, thus hindering the use of better alternative location methods because accuracy of conventional fingerprinting is difficult to evaluate without using external data.

SUMMARY

A fingerprinting methodology is generalized to include non-RF related factors such as, for example, GPS (global positioning system) quality (such as HEPE (horizontal estimated position error) information), device type information, client identification data, speed of the device, the operating system (OS) utilized by the device, and so forth. For each tile, there is an associated distance function between two fingerprints (the training fingerprint and the test fingerprint) from within that tile which may be a linear or non-linear combination of the deltas between multiple factors of the two fingerprints. For several implementations, the characteristics of the tile may include non-RF information such as, for example, a distribution of GPS HEPE.

The distance function for each tile is derived from a training dataset corresponding to that specific tile and, in certain implementations, to one or more neighboring tiles. This distance function is then optimized to minimize the total difference between real distances and predicted distances. Thereafter, upon receipt of an inference request, a result may be derived from a combination of the k fingerprints from the training dataset having the least distance per application of the distance function. A test dataset may also be used to predict the likely error for the tile, which in turn can be used to ascertain whether there is a need to rely on other location method(s). Separately, the test dataset can also be used to determine whether cache data for fingerprints should be created and delivered to mobile devices.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

To facilitate an understanding of and for the purpose of illustrating the present disclosure and various implementations, exemplary features and implementations are disclosed in, and are better understood when read in conjunction with, the accompanying drawings—it being understood, however, that the present disclosure is not limited to the specific methods, precise arrangements, and instrumentalities disclosed. Similar reference characters denote similar elements throughout the several views. In the drawings:

FIG. 3 is an exemplary flowchart illustrating operation of a computing device to calculate aggregate accuracy values associated with performance of location determination methods;

DETAILED DESCRIPTION

Figure 1:
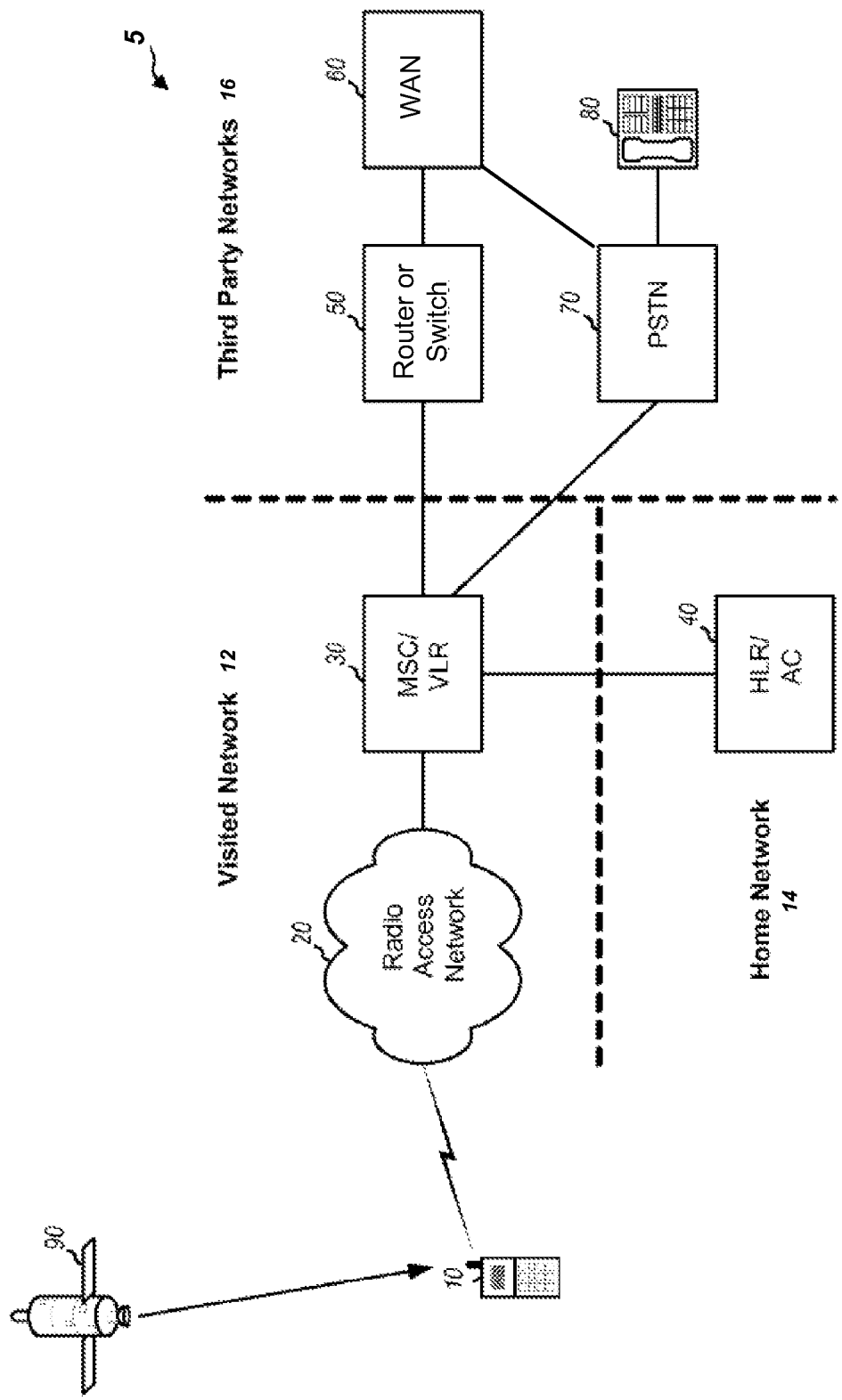
FIG. 1 is an illustration of an exemplary mobile communications network.

The Global Positioning System (GPS) is a satellite navigation system that uses more than two dozen GPS satellites that orbit the Earth and transmit radio signals which are received by and allow GPS receivers to determine their own location, speed, and direction. Thus, the GPS satellites transmit signals to GPS receivers on the ground, and the GPS receivers passively receive these satellite signals and process them (but generally do not transmit any signals of their own).

The horizontal estimated position error (HEPE) is a measure of the GPS receiver's accuracy with regard to its determination of its location on the ground (longitude and latitude). For example, if a GPS receiver's HEPE is 43 feet, the GPS receiver has determined that its calculated position (without regard to altitude) is accurate to within 43 feet. Similarly, an estimated position error (EPE) is a measure of the GPS receiver's accuracy with regard to its determination of its three-dimensional location (longitude, latitude, and altitude); however, there is inherent difficulty in calculating altitude with GPS, and thus EPE is generally larger (sometimes substantially larger) than the HEPE. Viewed differently, a HEPE is basically an EPE without the inaccuracy of an altitude determination.

In general, a GPS receiver requires an unobstructed view of a minimum number of GPS satellites in the sky in order to perform a location determination (at least three satellites for longitude and latitude, and at least four satellites to further include altitude). Consequently, GPS receivers often do not perform well in forested areas, among tall buildings in a city setting, or inside buildings and other structures. To assist the GPS receiver in such environments, some location devices may use various forms of Positioning Services (PS) to assist the GPS receiver in determining its location or to independently determine the location in lieu of the GPS receiver. For example, A-GPS ("Assisted-GPS") is a well-known PS technology that uses an assistance server to reduce the time needed to determine a location using GPS.

Positioning Services (PS) are a combination of computational servers and ground-based "beacons" (such as cell towers, discussed further herein) that provide the ability for a location device to obtain its current location and, in certain implementations, to provide additional services such as identifying nearby points-of-interest such as gas stations, hotels, restaurants, banks, stores, coffee shops, shopping, parking, etc. For example, the Business Mobility Framework (BMF) is a PS infrastructure that allows server-based PS solutions to request and obtain device location information. PS can also be used to support Enhanced Local Search (ELS) functionality via the Internet to execute local search queries to find locations and obtain directions to desired destinations, both indoors and outdoors.

Advanced Forward Link Trilateration (AFLT) is a method of location determination that utilizes base station triangulation to calculate location for a mobile communication device. To determine location, the mobile device takes measurements of signals from nearby mobile communications base stations (a.k.a., "cell towers") and reports time/distance readings back to the communication network which are then used to triangulate an approximate location of the handset. Similar to GPS, at least three surrounding base stations are required to get a position fix, although AFLT does not use GPS satellites (and only uses cell towers) to determine location. Thus the accuracy of AFLT is limited to the geometry of the cell towers surrounding the device requesting location information—the better the triangulation the more accurate the fix. In any event, AFLT enables location services to work indoors, whereas outdoor location services often use the more accurate GPS signals when available.

When connecting to a mobile communications network, a mobile communications device often receives a "fix" (a generalized location corresponding to the nearest cell tower that will service the device) within seconds during the registration process. Often these fixes are then cached for several minutes and, during this time, any queries made using the mobile device will reuse the same generalized location information (the fix) on the assumption the mobile device is still in the same location absent evidence to the contrary (such as a lost signal).

Mobile locating refers to services provided by telecommunication companies to approximate the location of a mobile communications device—and thus are a form of PS. The underlying technology is based on measuring power levels and antenna patterns. Since a mobile communication device generally communicates wirelessly with the base station closest to it, and the identity of that base station and its location are readily ascertainable, the location of the device can be correctly presumed to be close to the respective base station. Some base stations employing more advanced location systems might also determine the sector in which the mobile phone resides (i.e., an approximate direction away from the base station) as well as estimate the distance from the base station. Further approximation and refinement may also be achieved by interpolating signals between the device and neighboring base stations. Where mobile traffic and density of base stations is sufficiently high, the precision of an estimated location may be determined to within 50 meters of actual location, whereas areas where base stations are distantly located one from another (such as a rural setting where many miles may lie between base stations) locations may be determined much less precisely.

Similarly, networks of land-based positioning transmitters (such as those comprising beacons) can enable specialized radio receivers to determine a two-dimensional position (longitude and latitude) on the surface of the Earth. Often these systems may be generally less accurate than any of the Global Navigation Satellite Systems (GNSS) such as GPS largely because the propagation of their signals is not entirely restricted to line-of-sight; however, they remain useful for environments unsuitable for GPS—such as underground or in indoor environments—and the corresponding receivers often require much less power than GNSS systems like GPS.

For example, LORAN-C is a terrestrial navigation system most commonly used to determine the position of a ship or aircraft. LORAN-C uses low frequency radio transmitters that use the time interval between radio signals received from three or more base stations. Recently, LORAN use has been in steep decline (with GPS being the primary replacement), although there is some interest in revitalizing LORAN—which operates in the low frequency portion of the EM spectrum from 90 to 110 kHz—since its signals are less susceptible to interference and can penetrate better into foliage and buildings than GPS signals.

Assisted GPS (A-GPS) is a system which, under certain conditions, can improve the startup performance (or "time-to-first-fix," TTFF) of a GPS receiver. A-GPS is used extensively with GPS-capable cellular phones as its development was accelerated by the U.S. Federal Communications Commission's "E911 Mandate" requiring that the location of a mobile communications device be made immediately available to emergency call dispatchers.

While standalone or autonomous GPS devices use only the signals from GPS satellites, an A-GPS device additionally uses PS network resources to help it locate and utilize the GPS satellites both faster and better in poor signal conditions. For example, in areas of very poor signal conditions (such as in a city), GPS signals may suffer multipath propagation (e.g., bouncing and reflecting off of buildings) or be weakened by passing through signal obstructions such as atmospheric conditions, walls and roofs, or tree cover. Consequently, when first powered on in these conditions, some autonomous GPS navigation devices may find it difficult to determine a location due to fragmentary signal reception, thereby rendering such devices unable to function unless and until clear signals can be received continuously for an adequate period of time (which may be several minutes).

An A-GPS device addresses these challenges by using data available from PS in two regards: satellite acquisition and position calculation. With regard to the former, PS-provided information might include orbital data for the GPS satellites that may allow the GPS receiver to lock on to a minimal number of satellites more rapidly. Moreover, the network can provide precise timing information used to render accurate GPS information. In addition, the general location of the device as determined by the nearby base stations enables the PS to provide information pertaining to local ionospheric conditions and other conditions that can adversely affect GPS signals. Regarding the latter, a PS "assistance server" generally possesses much higher computational power than the mobile device and, thus, can be used to more quickly perform the calculations used to determine location, and particularly the extremely difficult and complex calculations that use fragmentary GPS signals received by the mobile device. Indeed, in several A-GPS device implementations (such as those known as "MS-Assisted" A-GPS devices), the amount of CPU and programming used by the GPS receiver can be substantially reduced by offloading most of the work onto the assistance server. Conveniently, most A-GPS devices have the option of falling back to standalone or autonomous GPS operations when the network (and the assistance server) is unavailable. In addition, many mobile communications devices combine A-GPS and other location services including Wi-Fi positioning, base station triangulation, and other positioning technologies.

Mobile communications device locating also tracks the location of a device even when the device is in motion. To locate the device, the device itself emits at least the roaming signal to contact the next nearby antenna tower, which is a process that does not use an active call. Location determination may then be done by multilateration based on the signal strength to nearby antenna masts.

In order to route calls to a mobile communication device, base stations listen for a roaming signal sent from the device and then collectively determine which specific station is best able to communicate with the phone (e.g., the closest base station with adequate capacity for managing the device). As the mobile device changes location, the base stations monitor the signal and the device is handed-off (or "roamed") from a first station to an adjacent second station as appropriate. Thus, by comparing the relative signal strength from multiple antenna towers, a general location of a phone can be roughly determined. The location can be even more precisely determined when a base station's antenna pattern supports angular determination and phase discrimination. Indeed, the accuracy of various base station locating techniques varies, with a connection to a single base station (the location of the base station corresponding to a "cell identification" as a surrogate for the device location) being the least accurate, triangulation with multiple base stations being moderately accurate, and certain "Forward Link" timing methods as being the most accurate. Moreover, the accuracy of these techniques (collectively referred to as "network-based") is dependent both upon the concentration of the base stations—with urban environments achieving the highest possible accuracy—as well as the implementation of the most current timing methods.

In contrast to network-based techniques, handset-based location technologies generally use the installation of client software on the mobile communication device in order to autonomously determine location. Such techniques then determine the location of the device by computing location by cell identification and the signal strengths of the home and neighboring cells (i.e., base stations) which is continuously sent to the carrier network. In addition, if the device is also equipped with GPS then significantly more precise location information may be sent from the handset to the carrier.

Hybrid positioning systems use a combination of network-based and handset-based technologies for location determination. One example would be some modes of A-GPS, which can both use GPS and network information to compute the location (although in most A-GPS systems all computations are done by the handset, and the network is only used to initially acquire and use the GPS satellites).

FIG. 1 is an illustration of an exemplary mobile communications network 5. The mobile communications network 5 may include a visited network 12, a home network 14, and third party networks 16. The visited network 12 may also be referred to as a Visited Public Land Mobile Network (VPLMN), a serving network, a roaming network, etc. Home network 14 may also be referred to as a Home Public Land Mobile Network (HPLMN). The visited network 12 may be a serving network for a mobile communications and/or computer (MCC) device 10 which may be operating in or roaming from its home network 14. Conversely, the visited network 12 and home network 14 may be the same network if the MCC device 10 is not roaming.

The visited network 12 may include one or more base stations at the radio access network (RAN) 20, a Mobile Switching Center (MSC)/Visitor Location Register (VLR) 30, and other network entities not shown in FIG. 1 for simplicity. RAN 20 may be a Global System for Mobile Communications (GSM) network, a Wideband Code Division Multiple Access (WCDMA) network, a General Packet Radio Service (GPRS) access network, wireless fidelity (Wi-Fi) network, 14G/Wi-Max network, a Long Term Evolution (LTE) network, CDMA X network, a High Rate Packet Data (HRPD) network, an Ultra Mobile Broadband (UMB) network, etc. GSM, WCDMA, GPRS and LTE are part of Universal Mobile Telecommunication System (UMTS) and are described in documents from an organization named "3rd Generation Partnership Project" (3GPP). CDMA X and HRPD are part of cdma2000, and cdma2000 and UMB are described in documents from an organization named "3rd Generation Partnership Project 2" (3GPP2). The MSC may perform switching functions for circuit-switched calls and may also route Short Message Service (SMS) messages. The VLR may store registration information for terminals that have registered with visited network 12.

Home network 14 may include a Home Location Register (HLR)/Authentication Center (AC) 40 and other network entities not shown in FIG. 1 for simplicity. The HLR may store subscription information for terminals (including MCC device 10) that have service subscription with home network 14. The AC may perform authentication for terminals (including MCC device 10) having service subscription with home network 14.

Third party networks 16 may include a router or switch 50, a Public Switched Telephone Network (PSTN) 70, and possibly other network entities not shown in FIG. 1. Router or switch 50 may route communications between MSC/VLR 30 and a wide area network (WAN) 60 (such as the Internet). PSTN 70 may provide telephone services for conventional wireline telephones, such as a telephone 80. Of course, FIG. 1 shows only some of the network entities that may be present in the visited network 12 and the home network 14. For example, visited network 12 may include network entities supporting packet-switched calls and other services, as well a location server to assist in obtaining location information for a terminal, e.g., MCC device 10, as discussed elsewhere herein.

The MCC device 10, as a wireless communications terminal, may be also be thought of (and variously referred to as) a mobile station (MS) in GSM and CDMA X, a user equipment (UE) in WCDMA and LTE, an access terminal (AT) in HRPD, a SUPL enabled terminal (SET) in Secure User Plane Location (SUPL), a subscriber unit, a station, and so forth. The MCC device 10 may also comprise or communicate with a personal navigation device (PND), and satellite signal reception, assistance data reception, and/or position-related processing may occurs at the MCC device 10 or, alternatively, at the PND. The MCC device 10 may have a service subscription with home network 14 and may be roaming in visited network 12, as shown in FIG. 1.

When activated, the MCC device 10 may receive signals from RAN 20 in visited network 12 and communicate with the RAN 20 to obtain communication services. The MCC device 10 may also communicate with home network 14 for communication services when not roaming. The MCC device 10 may also receive, via its PND, signals from one or more satellites 90 which may be part of a satellite positioning system (SPS). As used herein an SPS may include any combination of one or more global and/or regional navigation satellite systems and/or augmentation systems, and SPS signals may include SPS, SPS-like, and/or other signals associated with such one or more SPS. As such, the MCC device 10 may measure signals from satellites 90 and obtain pseudorange measurements for the satellites. The MCC device 10 may also measure signals from base stations in RAN 20 and obtain timing and/or signal strength measurements for the base stations. The pseudo-range measurements, timing measurements and/or signal strength measurements may be used to derive a position estimate or location estimate and location information for the MCC device 10, as discussed elsewhere herein.

Wi-Fi positioning system (WPS) can also provide position in certain situations (such as indoors) by taking advantage of the rapid growth of wireless access points (WAPs) in urban areas. A provider of this type of service maintains a public database and can determine the position for a device based on the specific access points accessible from the device in each specific location. The localization technique used for positioning with wireless access points is based on measuring the intensity of the received signal (Received Signal Strength or "RSS") and "fingerprinting" the possible locations (usually arranged in a grid comprising a plurality of tiles). The accuracy of such approaches depends on the number of positions that have been entered into the database. The possible signal fluctuations that may occur, however, can increase errors and inaccuracies in the path of the user. To minimize fluctuations in the received signal, certain techniques can be applied to filter this kind of "noise," and various implementations disclosed herein are related to such techniques.

It should be noted that a difference between fingerprinting and triangulation lies in the database used by the former with which the possible locations are compared to. More specifically, in fingerprinting, the signal levels detected from a Wi-Fi device are still found using multiple access points as in triangulation. However, in contrast to triangulation which attempts to determine a distance from each access point, in fingerprinting the combined signals are then compared with the database that contains power levels of each point on the map and the fingerprinting database is further calibrated by measuring power at different locations. In this way, fingerprinting is able to take into account such factors as reflection, attenuation, and multi-path signal propagation which create uncertainty in other techniques such as triangulation.

However, in practical applications, conventional fingerprinting approaches are difficult to scale and implement for several reasons. For example, conventional approaches rarely make effective use of crowd-sourced-only data and thus often use labor-intensive calibration in the local environment. Moreover, such approaches generally do not make of use of non-RF related information that may help improve performance, thus hindering the use of better alternative location methods because accuracy of conventional fingerprinting is difficult to evaluate without using external data.

For various implementations disclosed herein, a fingerprinting methodology is generalized to include non-RF related factors such as, for example, GPS quality (such as HEPE information), device type information, client identification data, speed of the device, the operating system (OS) utilized by the device, and so forth. For each tile, there is an associated distance function between two fingerprints (the training fingerprint and the test fingerprint) from within that tile which may be a linear or non-linear combination of the deltas between multiple factors of the two fingerprints. For several implementations, the characteristics of the tile may include non-RF information such as, for example, a distribution of GPS HEPE.

The distance function for each tile is derived from a training dataset corresponding to that specific tile and, in certain implementations, to one or more neighboring tiles. This distance function is then optimized to minimize the total difference between real distances and predicted distances. Thereafter, upon receipt of an inference request, a result may be derived from a combination of the k fingerprints from the training dataset having the least distance per application of the distance function. A test dataset may also be used to predict the likely error for the tile, which in turn can be utilized to ascertain whether there is a need to rely on other location method(s). Separately, the test dataset can also be used to determine whether cache data for fingerprints should be created and delivered to mobile devices.

Figure 2A:
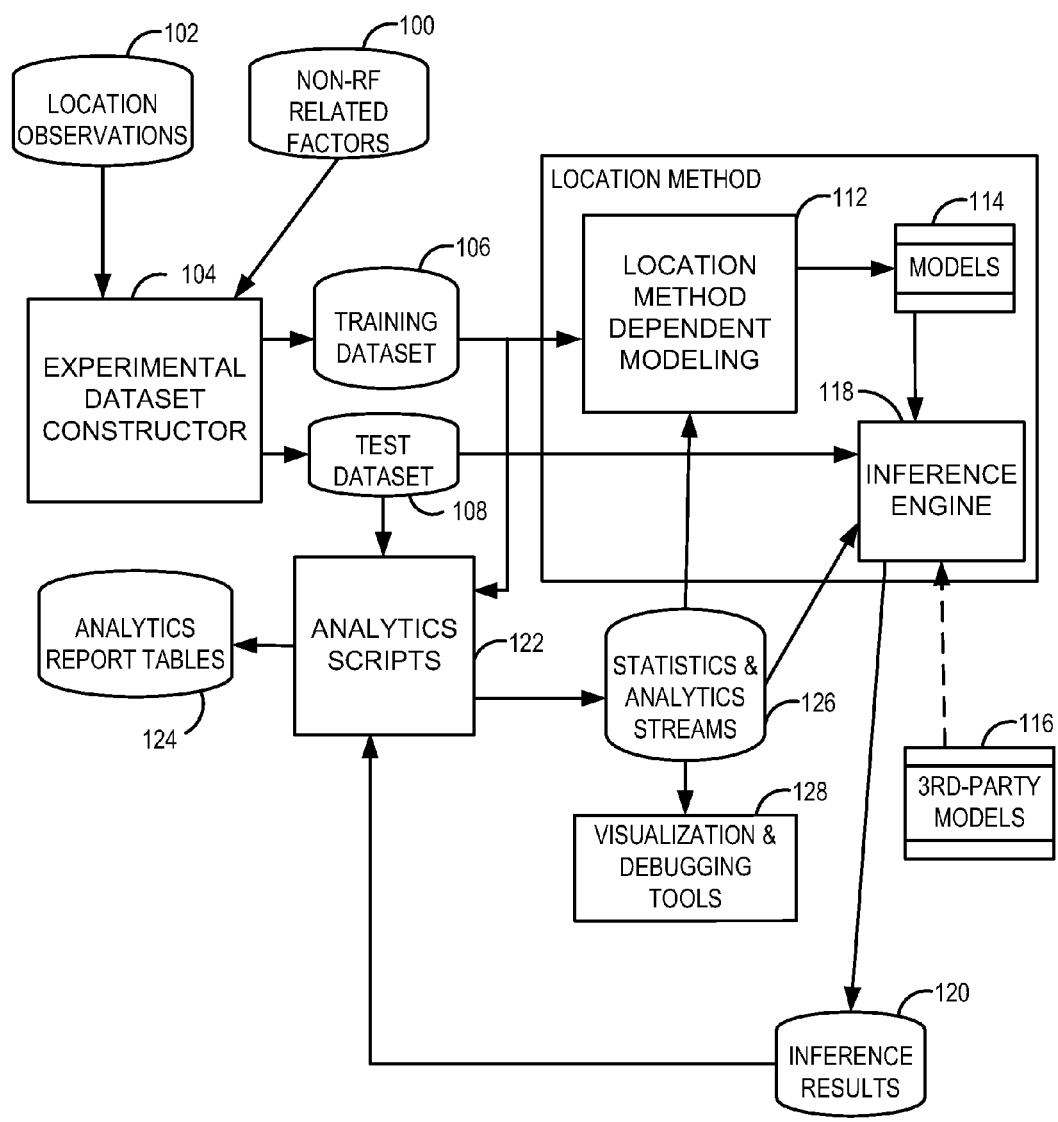
FIG. 2A is an exemplary block diagram illustrating a locating experimentation framework for analyzing location determination methods using location observations divided into a training dataset and a test dataset.
Figure 2B:
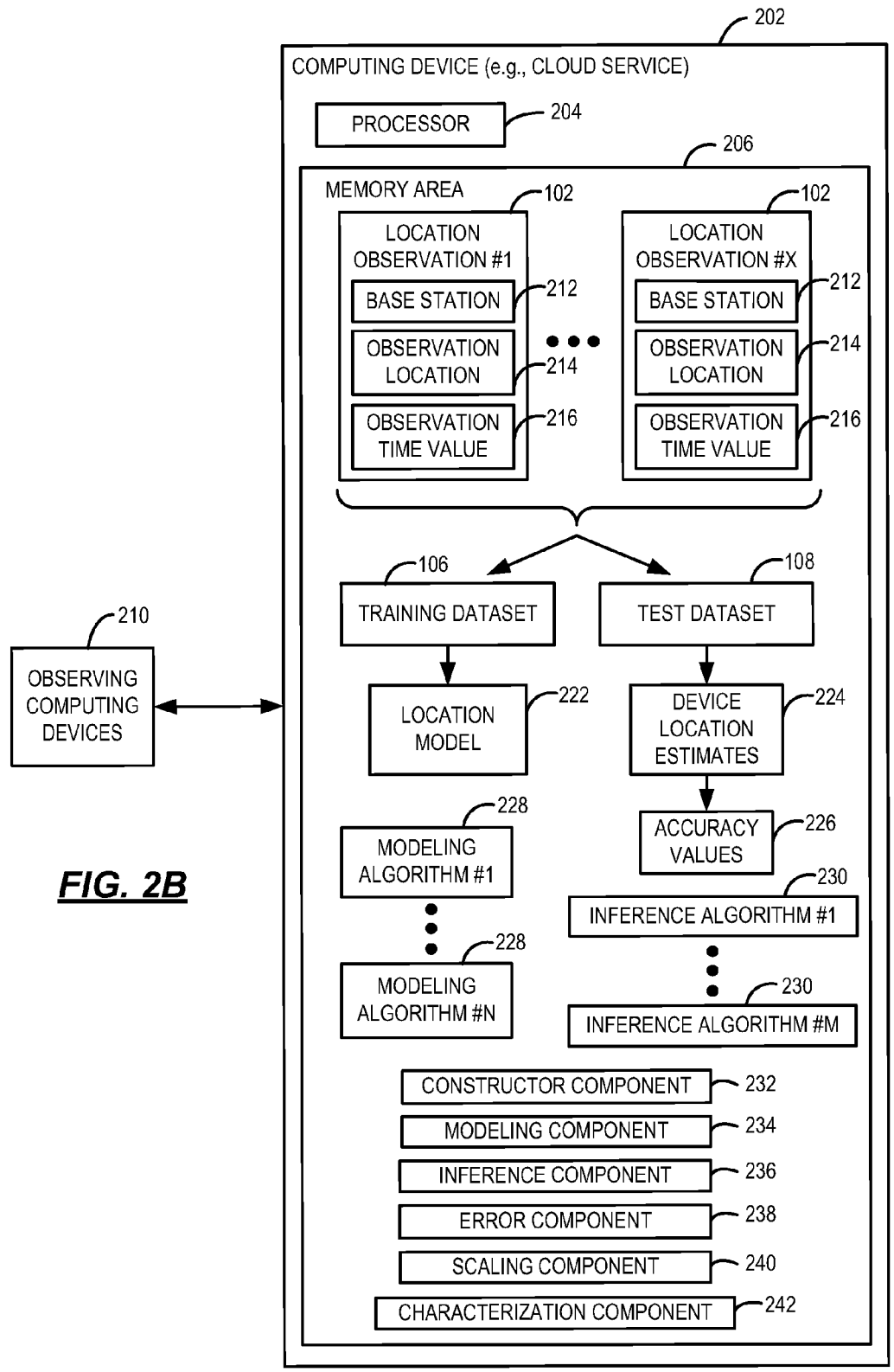
FIG. 2B is an exemplary block diagram illustrating a computing device for analyzing modeling algorithms and location inference algorithms based on the results of the locating experimentation framework of FIG. 2A.

FIG. 2A is an exemplary block diagram illustrating a locating experimentation framework for analyzing location determination methods using location observations (fingerprints obtained from known locations) that are divided into a training dataset and a test dataset. FIG. 2B is an exemplary block diagram illustrating a computing device for analyzing modeling algorithms and location inference algorithms based on the results of the locating experimentation framework of FIG. 2A.

Referring to FIGS. 2A and 2B (collectively referred to hereinafter as FIG. 2), various implementations disclosed herein are operable in an environment in which MCC devices such as mobile computing devices or other observing computing devices 210 (an example of which is described with respect to FIG. 8) observe or detect one or more base stations 212 at approximately the same time (e.g., an observation time value 216) while the device is at a particular location (e.g., an observation location 214). The set of observed base stations 212, the observation location 214, the observation time value 216, and possibly other attributes constitute a location observation as well as non-RF related factors 100. The mobile computing devices detect or observe the base stations 212, or other cell sites, via one or more radio frequency (RF) sensors associated with the mobile computing devices. Aspects of the disclosure are operable with any base station supporting any quantity and type of wireless communication modes including cellular division multiple access (CDMA), Global System for Mobile Communication (GSM), wireless fidelity (Wi-Fi), 4G/Wi-Max, and the like. Exemplary base stations 212 include cellular towers (or sectors if directional antennas are employed), base stations, base transceiver stations, base station sites, wireless fidelity (Wi-Fi) access points, satellites, or other wireless access points (WAPs). While aspects of the disclosure may be described with reference to base stations 212 implementing protocols such as the 802.11 family of protocols, implementations of the disclosure are operable with any base station for wireless communication. Moreover, while aspects of the disclosure may be described with reference to any specific base station for wireless communication (e.g., "base station"), such implementations explicitly include, for alternative implementations, the use of any other base station for wireless communication (e.g., "cell tower"), and thus terms referring to base stations 212 for wireless communication are used interchangeably herein without loss of generality.

Referring to FIG. 2A, an exemplary block diagram illustrates the location experimentation framework for analyzing location determination methods using both RF-based location observations 102 as well as non-RF related factors 100 (such as GPS HEPE) which are together grouped into a training dataset 106 and a test dataset 108. The training dataset 106 includes training location observations, and the test dataset 108 includes test location observations. The location experimentation framework includes an experimental dataset constructor 104, which divides location observations 102 and non-RF related factors 100 into the training dataset 106 and the test dataset 108. In some implementations, the training dataset 106 and the test dataset 108 are mutually exclusive (e.g., no overlap). In other implementations, at least one location observation and at least one non-RF location factor are included in both the training dataset 106 and the test dataset 108.

Referring more generally to FIG. 2 (i.e., both FIGS. 2A and 2B), and using locating method dependent modeling 112 (e.g., a modeling algorithm 228 and a location inference algorithm 230 in FIG. 2B), models 114 are constructed from the training dataset 106. An inference engine 118 applies at least one of the location inference algorithms to the test dataset 108 and uses the models 114 to infer location inference results 120 such as device location estimates 224 for the observing computing devices 210. In some implementations, the inference engine 118 also uses third-party models 116 to produce the location inference results 120. The device location estimates 224 represent inferred locations of the observing computing devices 210 in each of the location observations 102 in the test dataset 108, taking into account the non-RF related factors 100 that are available. Analytics scripts 122 analyze the inference results 120 in view of the training dataset 106 and the test dataset 108 to produce analytic report tables 124 and statistics and analytics streams 126. The analytics scripts 122, in general, calculate the accuracy of the locating method, such as an error distance. The statistics and analytics streams 126 are used by visualization and debugging tools 128 and by the inference engine 118.

Referring to FIG. 2B, an exemplary block diagram illustrates a computing device 202 for analyzing modeling algorithms 228 and location inference algorithms 230. In some implementations, the computing device 202 represents a cloud service for implementing aspects of the disclosure. For example, the cloud service may be a location service accessing location observations 102 stored in a base station store. In such implementations, the computing device 202 is not a single device as illustrated, but rather a collection of a plurality of processing devices and storage areas arranged to implement the cloud service. An example computing device is described with respect to FIG. 8.

In general, the computing device 202 represents any device executing instructions (e.g., as application programs, operating system functionality, or both) to implement the operations and functionality associated with the computing device 202. The computing device 202 may also include a mobile computing device or any other portable device. In some implementations, the mobile computing device includes a mobile telephone, laptop, tablet, computing pad, netbook, gaming device, and/or portable media player. The computing device 202 may also include less portable devices such as desktop personal computers, kiosks, and tabletop devices. Additionally, the computing device 202 may represent a group of processing units or other computing devices.

The computing device 202 has at least one processor 204 and a memory area 206. The processor 204 includes any quantity of processing units, and is programmed to execute computer-executable instructions for implementing aspects of the disclosure. The instructions may be performed by the processor 204 or by multiple processors executing within the computing device 202, or performed by a processor external to the computing device 202. In some implementations, the processor 204 is programmed to execute instructions such as those described elsewhere herein.

The computing device 202 further has one or more computer readable media such as the memory area 206. The memory area 206 includes any quantity of media associated with or accessible by the computing device 202. The memory area 206 may be internal to the computing device 202 (as shown in FIG. 2B), external to the computing device 202 (not shown), or both (not shown). The memory area 206 stores, among other data, one or more location observations 102 such as location observation #1 through location observation #X, as well as any non-RF related factors 100. In the example of FIG. 2B, each of the location observations 102 includes a set of one or more base stations 212, an observation location 214, an observation time value 216, and other properties describing the observed base stations 212 and/or the observing computing device (which may include the non-RF related factors 100). An exemplary observation location 214 may include values for a latitude, longitude, and altitude of the observing computing device as determined by RF fingerprinting and/or utilizing available non-RF related data. For example, the observation location 214 of the observing computing device may be determined via a global locating system (e.g., GPS) receiver associated with the observing computing device.

The computing device 202 may receive the location observations 102 (as well as any non-RF related factors 100) directly from the observing computing devices 210. Alternatively or in addition, the computing device 202 may retrieve or otherwise access one or more of the location observations 102 (or non-RF related factors 100) from another storage area such as a base station store. In such implementations, the observing computing devices 210 transmit, via a network, the location observations 102 (and the non-RF related factors 100) to the base station store for access by the computing device 202 (and possibly other devices as well). The base station store may be associated with, for example, a locating service that crowd-sources the location observations 102. The network includes any means for communication between the observing computing devices 210 and the base station store or the computing device 202.

As described herein, aspects of the disclosure operate to divide, separate, construct, assign, or otherwise create the training dataset 106 and the test dataset 108 from the location observations 102 and the non-RF related factors 100 (e.g., non-RF related location factors). Aspects of the disclosure further calculate, using various models, the estimated locations (e.g., device location estimates 224) of the observing computing devices 210 in the test dataset 108. Each of the device location estimates 224 identifies a calculated location of one of the observing computing devices 210 (e.g., mobile computing devices) in the test dataset 108.

The memory area 206 further stores accuracy values 226 derived from a comparison between the device location estimates 224 and the corresponding observation locations, as described herein. The accuracy values 226 represent, for example, an error distance. The memory area 206 further stores one or more modeling algorithms 228 and one or more location inference algorithms. Alternatively or in addition, the modeling algorithms and location inference algorithms are stored remotely from the computing device 202. Collectively, the modeling algorithms and location inference algorithms may be associated with one or more of a plurality of location determination methods, and provided by a locating service.

The memory area 206 further stores one or more computer-executable components. Exemplary components include a constructor component 232, a modeling component 234, an inference component 236, an error component 238, a scaling component 240, and a characterization component 242. The constructor component 232, when executed by the processor 204, causes the processor 204 to separate the crowd-sourced location observations 102 and the non-RF related location factors into the training dataset 106 and the test dataset 108. The constructor component 232 assigns the crowd-sourced location observations 102 to one or more geographic tiles or other geographic areas based on the observation locations 214 in each of the crowd-sourced location observations 102. In some implementations, the crowd-sourced location observations 102 (and/or the non-RF related location factors 100) may be grouped by base station to enable searching for location observations 102 based on a particular base station of interest.

The modeling component 234, when executed by the processor 204, causes the processor 204 to determine the location model 222 based on the location observations in the training dataset 106. In implementations that contemplate base station location estimate, for each base station, the base station location estimates are calculated based on the observation locations in the training dataset 106 associated with the base station. That is, aspects of the disclosure infer the location of each base station based on the location observations in the training dataset 106 that involve the base station. As a result, in such implementations, the modeling component 234 generates models 114 including a set of base stations 212 and approximate locations of the base stations 212.

The modeling component 234 implements at least one of the modeling algorithms 228. The inference component 236, when executed by the processor 204, causes the processor 204 to determine, for each of the location observations in the test dataset 108, the device location estimate for the observing computing device 210 based on the appropriate model determined by the modeling component 234. The inference component 236 implements the location inference algorithms 230, and is operable with any exemplary algorithm (e.g., refining algorithm) for determining a location of one of the observing computing devices 210 based on the location model 222, as known in the art. For each of the location observations in the test dataset 108, the inference component 236 further compares the device location estimate 224 for the observing computing device 210 to the known observation location 214 of the observing computing device 210 in the test dataset 108 to calculate the accuracy value 226.

The error component 238, when executed by the processor 204, causes the processor 204 to calculate an aggregate accuracy value for each of the tiles based on the calculated accuracy values 226 of the location observations assigned thereto in the test dataset 108. For example, the error component 238 groups the calculated accuracy values 226 of the test dataset 108 per tile, and calculates the aggregate accuracy value for each tile using the grouped accuracy values 226.

The scaling component 240, when executed by the processor 204, causes the processor 204 to adjust a size of the tiles to analyze the accuracy values 226 aggregated by the error component 238. The size corresponds to one of a plurality of levels of spatial resolution. As the size of the tiles changes, aspects of the disclosure re-calculate the aggregate accuracy values, and other analytics, for each of the tiles.

The characterization component 242, when executed by the processor 204, causes the processor 204 to calculate data quality attributes and data density attributes for the crowd-sourced location observations 102 in particular view of the non-RF related factors 100. Exemplary data quality attributes and exemplary data density attributes are described below with reference to FIG. 4. Further, the error component 238 may perform a trend analysis on the data quality attributes and the data density attributes calculated by the characterization component 242. The trend analysis illustrates how these statistics evolve over time. For example, for a given tile, the trend analysis shows how fast the observation density increases or how the error distance changes over time. In some implementations, the characterization component 242 compares the calculated aggregate accuracy values to base station density in, for example, a scatter plot.

Referring next to FIG. 3, an exemplary flowchart illustrates operation of the computing device 202 (e.g., cloud service) to calculate aggregate accuracy values associated with performance of location determination methods. In some implementations, the operations illustrated in FIG. 3 are performed by a cloud service such as a location determination service. At 302, the training dataset 106 and the test dataset 108 are identified. For example, the crowd-sourced location observations 102 and the non-RF related factors 100 (such as non-RF location or positioned observations) are divided into the training dataset 106 and the test dataset 108. The crowd-sourced location observations 102 may be divided based on the observation times associated therewith. For example, the training dataset 106 may include the crowd-sourced location observations 102 and/or the non-RF related factors 100 that are older than two weeks, while the test dataset 108 may include the crowd-sourced location observations 102 and/or the non-RF related factors 100 that are less than two weeks old. Aspects of the disclosure contemplate, however, any criteria for identifying the training dataset 106 and the test dataset 108. For example, the location observations 102 (as well as the non-RF related factors 100 in certain implementations) may be divided based on one or more of the following: geographic area, type of observing computing device, location data quality, mobility of observing computing device, received signal strength availability, and scan time difference (e.g., between the ends of Wi-Fi and GPS scans).

Further, in some implementations, the crowd-sourced location observations 102 and/or the non-RF related factors 100 are preprocessed to eliminate noisy data or other data with errors. For example, the crowd-sourced location observations 102 may be validated through data type and range checking and/or filtered to identify location observations 102 that have a low mobility indicator.

Each of the crowd-sourced location observations 102 has an observing computing device (e.g., a mobile computing device) associated therewith. At 304, the crowd-sourced location observations 102 are assigned to one or more geographic areas. The crowd-sourced location observations 102 may be assigned based on a correlation between the geographic areas and the observation locations 214 associated with each of the crowd-sourced location observations 102.

At 306, a model is determined from the training dataset 106, and a location estimate is calculated by executing a selection of at least one of the modeling algorithms. In addition to RF related data, the generalized fingerprinting or distance determining method may incorporate additional attributes such as device type and so forth. As known and appreciated by skilled artisans, finding the least distance is a classic optimization problem requiring the determination of a function that minimizes the error of predicted error distance versus actual error distance which, for the implementations disclosed herein, pertain to the training data set. Regardless, the model built from the training dataset in this approach may be similar to the training dataset itself in that it might have an observation (i.e., a fingerprint with its associated GPS location), along with the identification of the specific tile for each observation (at a determined level of detail within the tile system). Hence the inference call from the client provides a fingerprint which can be compared against the observations in the model and ranked based on the distance from the client fingerprint. Many fingerprint properties may be used such as the number of common base towers detected, the signal strength of those base towers, the device type, HEPE, speed, and so forth, and lesser distances are given higher scores (i.e., the least distance may be given the highest score). The top-ranked observations may then be used to determine user location.

At 308, device location estimates 224 for the observing computing devices 210 associated with the location observations in the test dataset 108 are determined. For example, the device location estimate for the observing computing device 210 in one of the location observations in the test dataset 108 is determined based on the location model 222. The device location estimates 224 are calculated by executing a selection of at least one of the location inference algorithms 230.

At 310, for each of the location observations in the test dataset 108, the determined device location estimate 224 is compared to the observation location 214 of the observing computing device 210 associated with the location observation. The comparison produces the accuracy value 226. In some implementations, the accuracy value 226 represents an error distance, a distance between the observation location 214 of the observing computing device 210 and the calculated device location estimate 224 of the observing computing device 210, or any other measure indicating accuracy.

At 312, for each of the geographic areas, the accuracy values 226 associated with the location observations assigned to the geographic area from the test dataset 108 are combined to calculate an aggregate accuracy value. For example, a mean, median, cumulative distribution function, trend analysis, or other mathematical function may be applied to the accuracy values 226 for each of the geographic areas to produce the aggregate accuracy value for the geographic area.

In some implementations, the training dataset 106 and the test dataset 108 are characterized or otherwise analyzed to produce dataset analytics at 305. Exemplary dataset analytics include data quality attributes, data density attributes, and an environment type (e.g., rural, urban, dense urban, suburban, indoor, outdoor, etc.) for each of the geographic areas. Further, the performance of the selected modeling algorithm 228 and the selected location inference algorithm 230 may be analyzed to produce quality analytics. In some implementations, the dataset analytics are correlated to the quality analytics to enable identification and mapping between qualities of the input data to the resulting performance of the location methods.

Another way to implement the location model is to pick a small tile in a densely populated area and determine the least distance values between all pairs of observations in that tile. A good least distance function may have scores above a certain limit for all pairs of observations (given that they are all in a very small tile). The location model may also be tuned based on the different parameters and then individually varying one parameter at a time to gauge its impact. For example, the impact of two fingerprints not generated from the same device might be significant compared to the number of common base towers detected by their corresponding devices. Moreover, fingerprint based algorithms are expected give different results based on the different selections of test and training data sets such that some might work better in very densely populated urban areas and poorly in more suburban or rural areas, in which case density might be more important than HEPE (for which the location model can adjust for accordingly). Regardless, the least distance observation may be used in the model as the likely inferred position for the device, and this can also be varied by the model in selecting the centroid of a number of model fingerprint positions (comprising the least distanced fingerprints or the fingerprints that have a least distance score over some threshold). Using the fingerprint, the model may then also perform some form of correction based on, for example, the speed and heading of the device to better model the fingerprint position.

Figure 4:
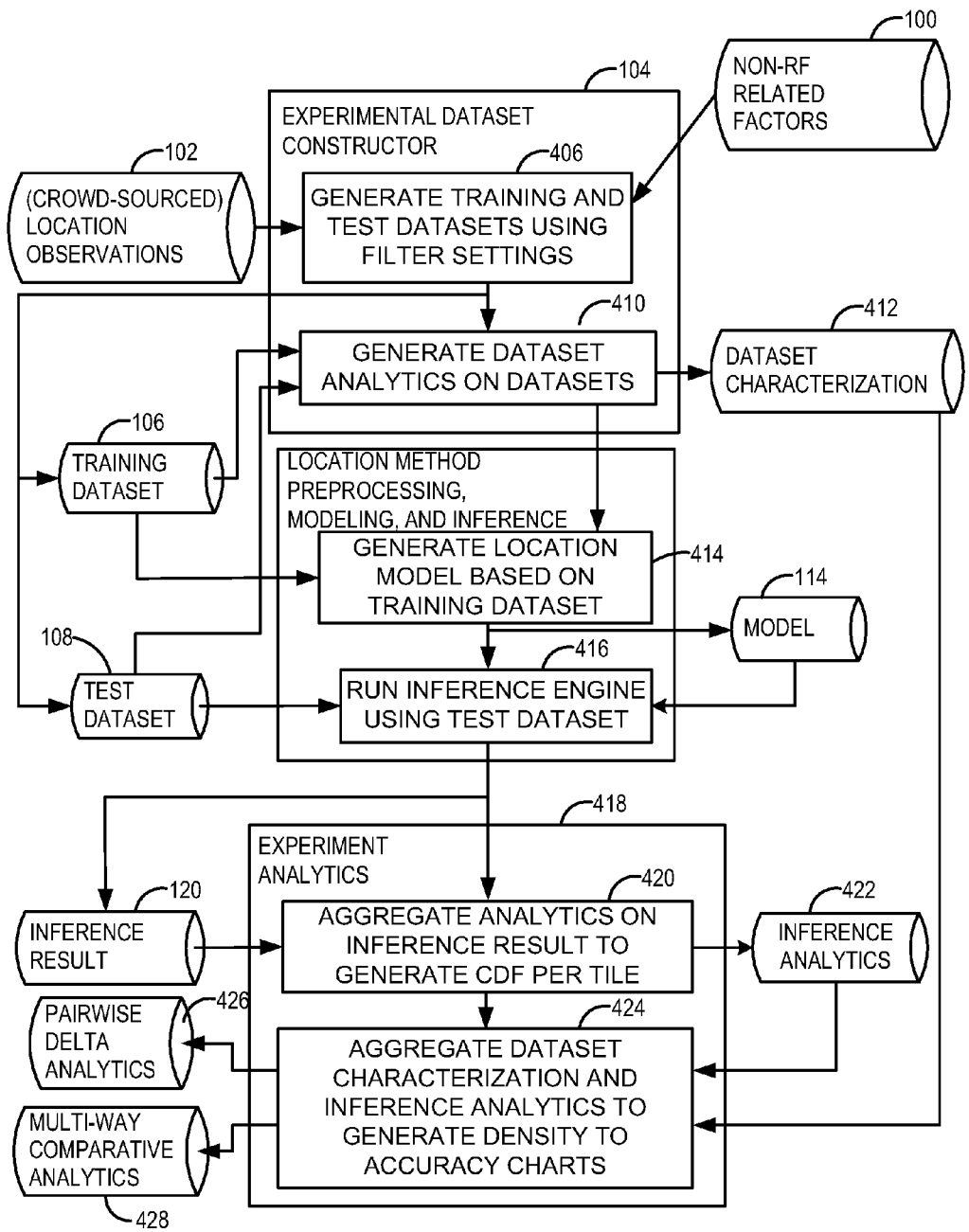
FIG. 4 is an exemplary block diagram illustrating a pipeline for performing analytics on location determination methods using datasets derived from location observations.

Referring next to FIG. 4, an exemplary block diagram illustrates a pipeline for performing analytics on location determination methods using datasets derived from location observations 102 and non-RF related factors 100. The experimental dataset constructor 104 takes crowd-sourced location observations 102 and the non-RF related factors 100 (such as non-RF location or positioned observations) and generates the training dataset 106 and the test dataset 108 based on, for example, filter settings at 406. Dataset analytics are generated for the training dataset 106 and the test dataset 108 at 410. The dataset analytics are stored as dataset characterizations 412.

Exemplary dataset analytics include characterizations in terms of one or more of the following, at various levels of spatial resolutions: cumulative distribution function, minimum, maximum, average, median, and mode. The dataset analytics include data quality attributes, data density attributes, and environment type. Exemplary data quality attributes include one or more of the following: HEPE, speed/velocity distribution, heading distribution, and delta time stamp. The HEPE represents the estimated 95% location error (e.g., in meters). The delta time stamp represents the difference (e.g., in milliseconds) between the completion of a Wi-Fi access scan and a GPS location fix. Exemplary data density attributes include one or more of the following: observation density (e.g., the number of observations per square kilometer), base station density (e.g., the number of base stations 212 per square kilometer), distribution of the number of base stations 212 per scan, and distribution of observations per base station 212.

Preprocessing, modeling, and inference are performed specific to a particular locating method. For example, the locating method includes at least one of the modeling algorithms 228 and at least one of the location inference algorithms 230. Models 114 are generated at 414 based on the training dataset 106. The inference engine 118 uses the models 114 at 416 to process the test dataset 108 and produce inference results 120.

Experiment analytics 418 are next performed. Analytics on the inference results 120 are aggregated at 420 to generate, for example, a cumulative distribution function (CDF) per geographic tile. The aggregated analytics are stored as inference analytics 422. The inference analytics combine different inference results 120 together and aggregate them by geographic tile. The dataset characterization and inference analytics are aggregated to generate, for example, density to accuracy charts at 424. Further, pairwise delta analytics 426 and multi-way comparative analytics 428 may also be performed. The pairwise delta analytics 426 and the multi-way comparative analytics 428 enable finding a correlation between training data properties and error distance analytics reports. The result of this data may be visually analyzed as a scatter graph or pivot chart. For example, the pairwise delta analytics 426 examine the difference between error distances of two alternative methods versus a data metric such as base station density. In another example, the multi-way comparative analytics 428 illustrate the relative accuracy of multiple experiments give a particular data quality or density metric. Other analytics are contemplated, such as per base station analytics.

In some implementations, the experiment analytics 418 have several levels of granularity. There may be individual inference error distances, intra-tile statistics (e.g., 95% error distance for a given tile), inter-tile analytics (e.g., an accuracy vs. base station density scatter plot for an experiment), and inter-experiment comparative analytics.

Exemplary intra-tile statistics include one or more of the following: test dataset analytics (e.g., base station total, base station density, base station count per inference request), query success rate, cumulative distribution function (e.g., 25%, 50%, 67%, 90%, and 95%), and other statistics such as minimum, maximum, average, variance, and mode. Exemplary inter-tile analytics are summarized form training data over a plurality of geographic tiles and may include scatter plots illustrating one or more of the following: error vs. observation density, error vs. observed base station density, error vs. number of access points used in the inference request, and error vs. data density and data quality.

Aspects of the disclosure may further relate dataset analytics to accuracy analytics. In some implementations, there is a continuous model (e.g., no estimate of base station location) and a discrete model, although other models are contemplated. In the continuous model, D is a data density function and Q is a data quality function. The function D is a data density function of observation density, base station density, and the distribution of the number of access points per scan. The function Q is a data quality function of HEPE distribution, speed distribution, delta time stamp distribution, and heading distribution. For a given training dataset 106 and a particular geographic tile, aspects of the disclosure calculate the data density indicator and the data quality indicator using the functions D and Q. When combined with a selected accuracy analytic A such as 95% error distance, aspects of the disclosure operate to create a three-dimensional scatter plot, where each data point in the plot is of the form (X=D, Y=Q, Z=A).

In the discrete model, for a particular training dataset 106, aspects of the disclosure classify each geographic tile that covers an area of the training dataset 106 as (D, Q), where values for D and Q are selected from a discrete set of values (e.g., low, medium, and high). As crowd sourced data grows in volume and improves in quality, more tiles are expected to move from (D=low, Q=low) to (D=high, Q=high).

Figure 5:
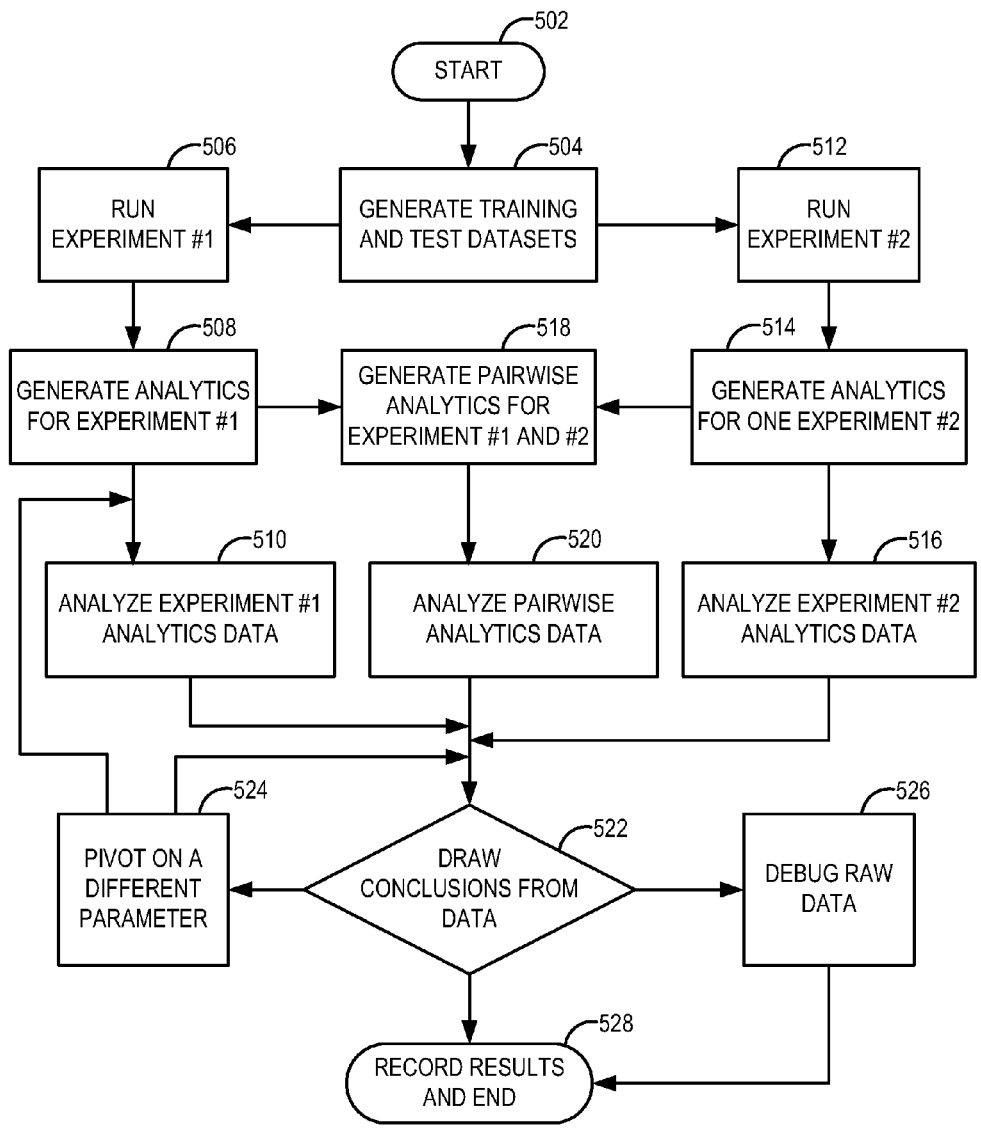
FIG. 5 is an exemplary experiment process flow diagram illustrating comparison of the performance of two experiments using different location determination methods.

Referring next to FIG. 5, an exemplary experiment process flow diagram illustrates comparison of the performance of two experiments using different location determination methods. The process begins at 502. The training dataset 106 and the test dataset 108 are generated at 504 from the crowdsourced location observations 102 and the non-RF related factors 100. At 506, a first experiment is conducted using a particular locating method (e.g., using at least one of the modeling algorithms 228 and at least one of the location inference algorithms 230 on a particular training dataset 106 and test dataset 108). Performance analytics are generated for the first experiment at 508, as described herein, and then analyzed at 510. For example, an error distance graph per tile may be created.

At 512, a second experiment is conducted using another locating method (e.g., different modeling algorithm 228 and/or different location inference algorithm 230 from the first experiment). Performance analytics are generated for the second experiment at 514, as described herein, and then analyzed at 516. Pairwise analytics are generated for the first and second experiments at 518, and then analyzed at 520. For example, an error distance difference per tile may be created for each of the locating methods to enable identification of the locating method providing the better accuracy (e.g., smaller error distance).

At 522, the analyzed analytics data may be reviewed to draw conclusions such as whether a correlation can be seen between any of the characteristics of the training dataset 106 and error distance, whether one locating method performs better than another for a particular combination of data quality and data density, and the like. If anomalies are detected (e.g., two tiles with similar observation density show varied error distance), the raw location observation data may be debugged at 526. Further, the experiments may be re-run after pivoting on a different parameter at 524. For example, if there is no correlation between observation density and error distance, the experiments may be re-run to determine whether there is a correlation between HEPE and error distance. In addition, at 528, the results are recorded and the process may end.

In some implementations, the operations illustrated in FIG. 5 may generally be described as follows. In a first experiment, a first one of a plurality of the modeling algorithms 228 is selected and executed with the training dataset 106 as input. This results in the creation of the location model 222 based on the training dataset 106. A first one of a plurality of location inference algorithms 230 is selected and executed with the test dataset 108 and the location model 222 as input. This results in creation of device location estimates 224 for the observing computing devices 210. The device location estimates 224 are compared to the observation locations 214 of the observing computing devices 210 to calculate accuracy values 226. The accuracy values 226 are assigned to the geographic areas based on the observation location 214 of the corresponding location observations in the test dataset 108. Aggregate accuracy values are created by combining the accuracy values 226 from each of the geographic areas.

In a second experiment, the location model 222 is recalculated using a second selected modeling algorithm 228 and the device location estimates 224 are recalculated using a second selected location inference algorithm 230. The aggregate accuracy values are re-calculated for each of the geographic areas to enable a comparison of the selected modeling algorithms 228 and the selected location inference algorithms 230 between the first experiment and the second experiment.

In some implementations, the computing selects the first or second modeling algorithms 228 and/or the first or second location inference algorithms 230 as the better-performing algorithm based on a comparison between the aggregated accuracy values of the first experiment and the second experiment.

In some implementations, a size of one or more of the geographic areas may be adjusted. The aggregate accuracy value, or other quality analytics, is calculated for each of the re-sized geographic areas by re-combining the corresponding accuracy values 226.

Figure 6:
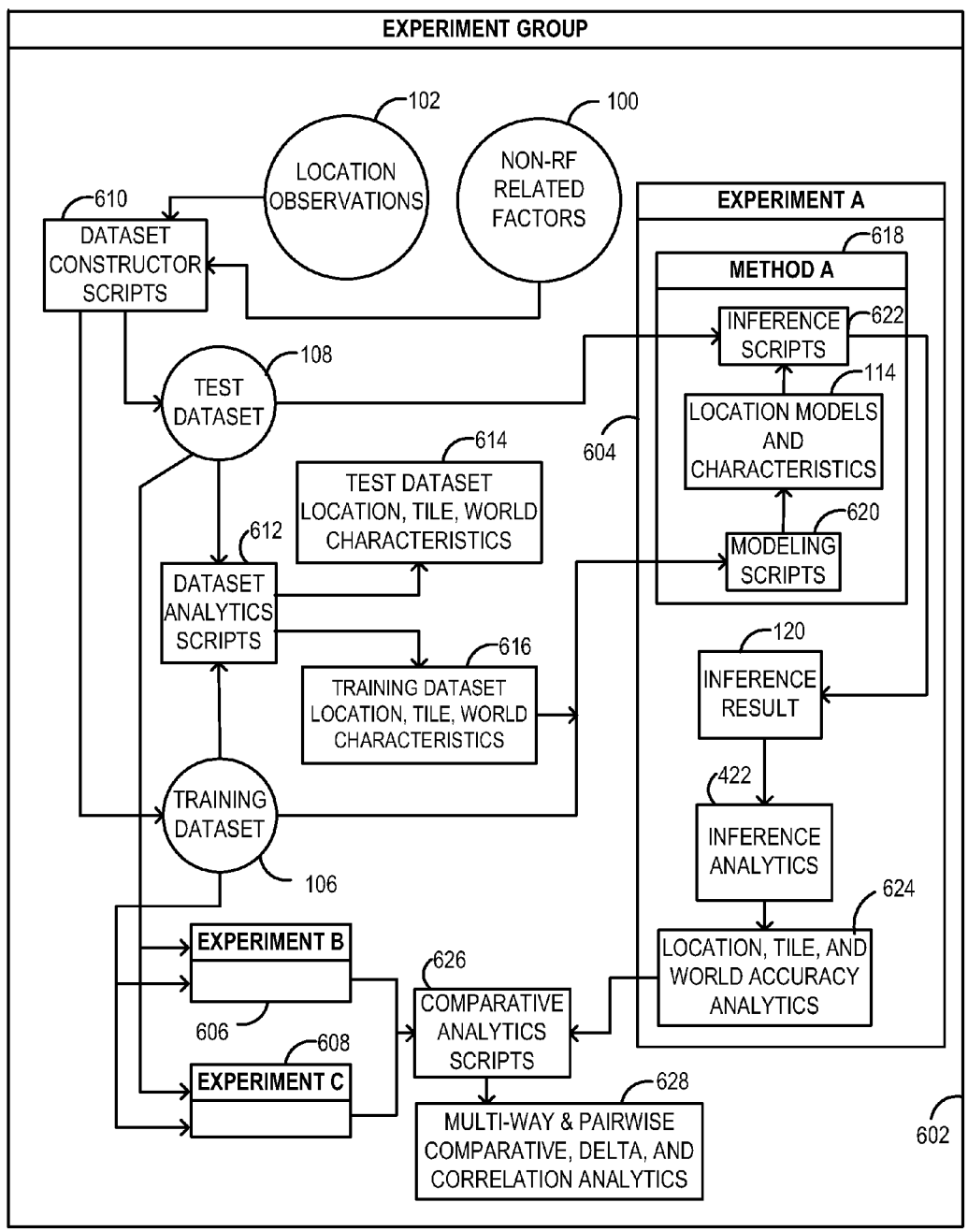
FIG. 6 is an exemplary block diagram illustrating an experiment group of three experiments for generating comparative analytics.

Referring next to FIG. 6, an exemplary block diagram illustrates an experiment group 602 of three experiments for generating comparative analytics. Each of the Experiment A 604, Experiment B 606, and Experiment C 608 represent the application of a selected modeling algorithm 228 and a selected location inference algorithm 230 to a particular training dataset 106 and test dataset 108. Dataset constructor scripts 610 create the training dataset 106 and the test dataset 108 from the location observations 102 and the non-RF related factors 100. Dataset analytic scripts 612 create training dataset characteristics 616 and test dataset characteristics 614 at the base station, tile, and world (e.g., multiple tiles) levels to characterize the output at multiple levels of spatial resolution. In this way, aspects of the disclosure characterize the input data at multiple levels of spatial resolution.

Experiment A 604 applies a particular location method 618. This includes executing modeling scripts 620 to create models 114. Inference scripts 622 apply the models 114 to the test dataset 108 to create the inference results 120. Inference analytics are obtained from the inference results 120 to produce accuracy analytics 624 at the base station, tile, and world (e.g., multiple tiles) levels.

Experiment B 606 and Experiment C 608 are performed using different location methods. Comparative analytic scripts 626 are performed on the accuracy analytics 624 from Experiment A 604 as well as the output from Experiment B 606 and Experiment C 608. Multi-way and pairwise comparative, delta, and correlation analytics are performed at 628.

Figure 7:
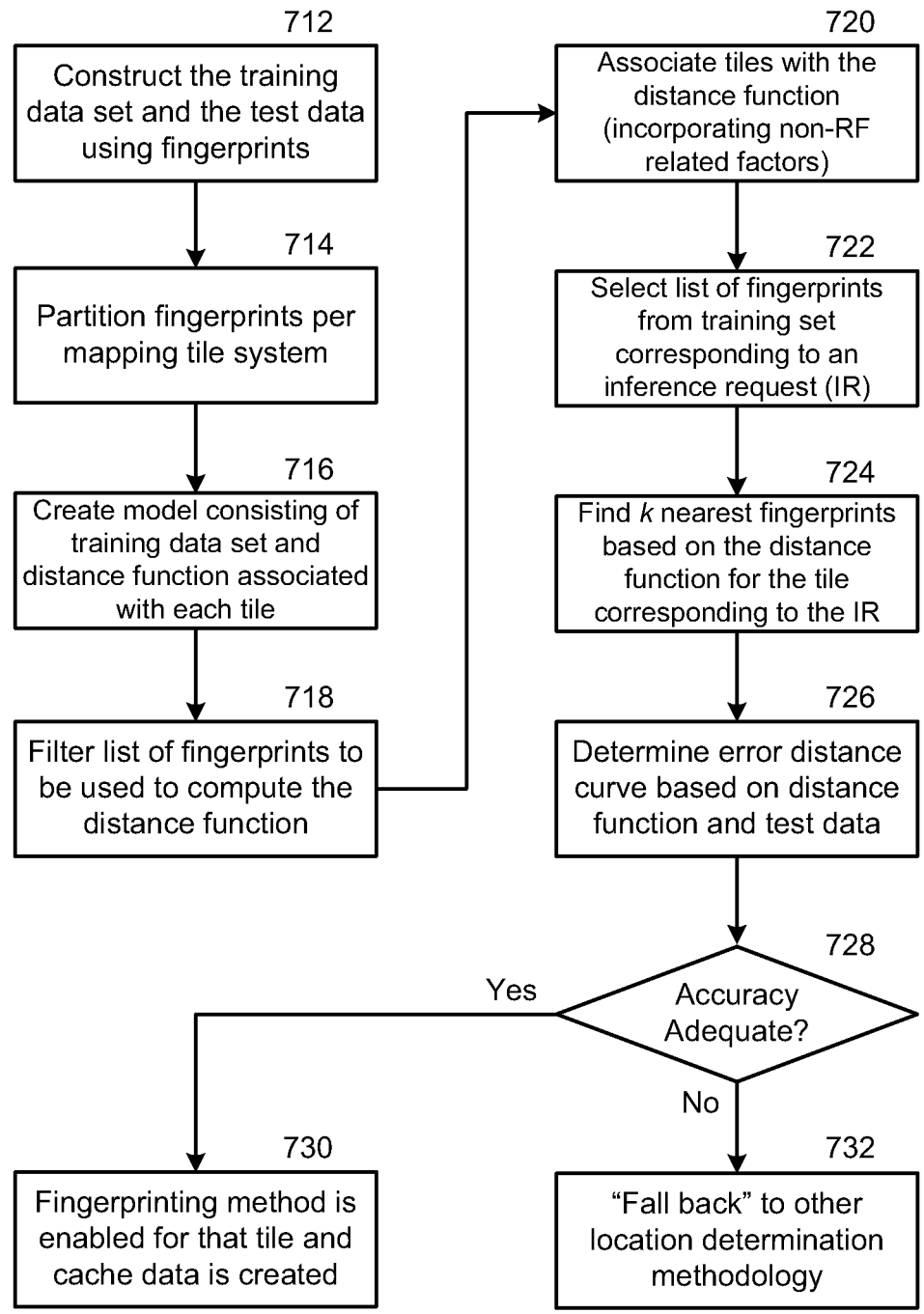
FIG. 7 is an exemplary flowchart illustrating operation of a computing device using generalized fingerprints (to include non-RF related factors) with regard to variation location determination methods.

FIG. 7 is an exemplary flow chart 700 illustrating operation of the computing device using generalized fingerprints (to include non-RF related factors) with regard to variation location determination methods. Referring to FIG. 7, the training and test datasets that consist of generalized fingerprints are constructed at 712. At 714, the fingerprints are then partitioned per a mapping tile system. At 716, a model is created that consists of training data set and a distance function associated for each tile. At 718, the list of fingerprints from the training dataset that will be used to compute the distance function is filtered, for example, to include all the fingerprints in the training dataset or a subset depending on the characteristics of the tile and the computational complexity.

At 720, each tile is then associated with a distance function, which can be linear or non-linear and is a function of the deltas between multiple factors between two fingerprints in the training dataset. This distance function may also incorporate some of the factors of the fingerprint that may not be available during an inference request, like GPS quality or the speed of the device while traveling in a vehicle, for example. In any event, the objective is to find the distance function that minimizes the differences between actual distances and predicted distances. For certain implementations, as the training dataset grows the distance function may be updated incrementally, and while a linear function may be less complex to solve, a non-linear function might be used in alternative implementations.

At 722, and given an inference request (IR), a list of fingerprints is selected from the training dataset against which the distance function was computed. Then, at 724, the k (a predetermined threshold number) nearest fingerprints in the training dataset are found (or determined) based on the distance function for the corresponding tile, where the predicted location is a combination of locations of the k-nearest fingerprints. At 726, an error distance curve (representative of an accuracy characteristic) for the tile is determined based on the distance function and test data for that tile. If the accuracy is adequate at 728, then at 730 the fingerprinting method is enabled for that tile and cache data (model fingerprints and distance function) is created; otherwise, at 732 the fingerprinting method is deemed too inaccurate and the system "falls back" to use some other method for location determination.

This method, illustrated by FIG. 7, provides techniques for forming generalized fingerprints that include non-RF related factors such as GPS quality, speed, device type, client ID, OS version, and so forth, by creating tile specific distance functions from a training dataset and filtering the training dataset to compute the distance function. In certain implementations, the method may incrementally update this distance function as the training dataset grows. Moreover, this approach also enables the selection of candidate fingerprints for the distance function from all of the crowd sourced data which other methodologies do not fully exploit. In addition, by inferring location from a combination of the k nearest fingerprints per the distance function, and by predicting likely error performance (accuracy) from a test dataset, this approach also enables the determination of whether the accuracy is acceptable; if not, to fall back to other location methods; and if so, to create cache data for mobile devices to resolve location on the device autonomously.

At least a portion of the functionality of the various elements in FIG. 2A, FIG. 2B, and FIG. 4 may be performed by other elements in the figures, or an entity (e.g., processor, web service, server, application program, computing device, etc.) not shown in the figures. In some implementations, the operations illustrated in FIG. 3 and FIG. 5 may be implemented as software instructions encoded on a computer readable medium, in hardware programmed or designed to perform the operations, or both. For example, aspects of the disclosure may be implemented as a system on a chip. Moreover, while no personally identifiable information is tracked by aspects of the disclosure, implementations have been described with reference to data monitored and/or collected from users. In such implementations, notice is provided to the users of the collection of the data (e.g., via a dialog box or preference setting) and users are given the opportunity to give or deny consent for the monitoring and/or collection. The consent may take the form of opt-in consent or opt-out consent.

Of course, the implementations illustrated and described herein as well as implementations not specifically described herein but within the scope of aspects of the invention constitute exemplary means for creating models 114 based on the training dataset 106, and exemplary means for comparing the accuracy of different modeling algorithms 228 and different location inference algorithms 230 based on the aggregated accuracy values for the tiles.

Figure 8:
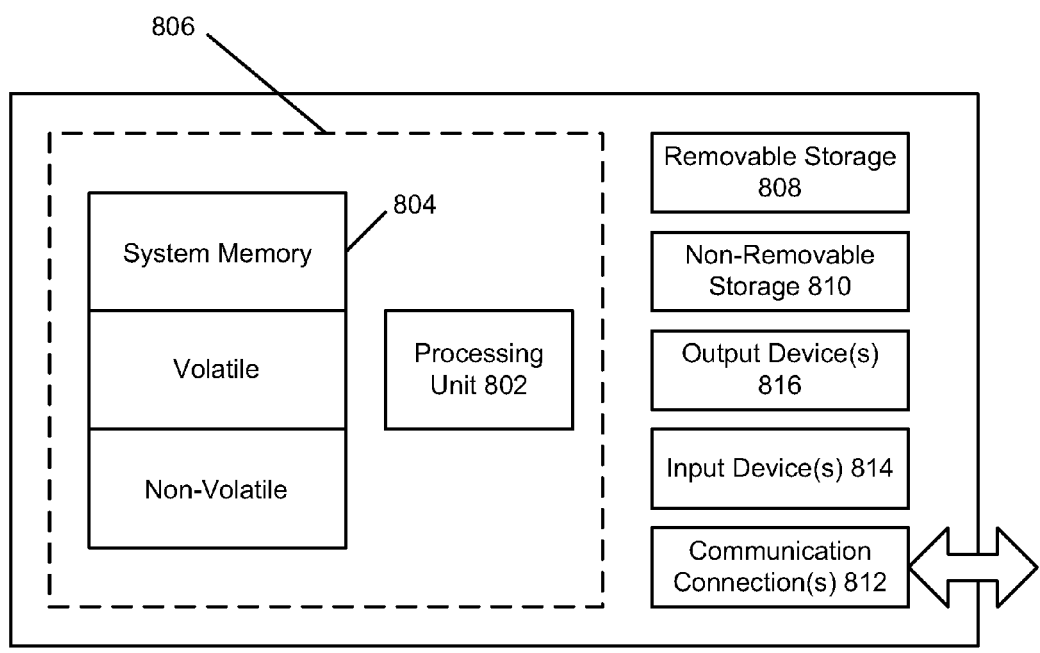
FIG. 8 shows an exemplary computing environment.

FIG. 8 shows an exemplary computing environment in which example implementations and aspects may be implemented. The computing system environment is only one example of a suitable computing environment and is not intended to suggest any limitation as to the scope of use or functionality. Numerous other general purpose or special purpose computing system environments or configurations may be used. Examples of well known computing systems, environments, and/or configurations that may be suitable for use include, but are not limited to, personal computers (PCs), server computers, handheld or laptop devices, mobile communications devices, multiprocessor systems, microprocessor-based systems, network personal computers, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 8, an exemplary system for implementing aspects described herein includes a computing device, such as computing device 800. In its most basic configuration, computing device 800 typically includes at least one processing unit 802 and memory 804. Depending on the exact configuration and type of computing device, memory 804 may be volatile (such as random access memory (RAM)), non-volatile (such as read-only memory (ROM), flash memory, etc.), or some combination of the two. This most basic configuration is illustrated in FIG. 8 by dashed line 806.

Computing device 800 may have additional features/functionality. For example, computing device 800 may include additional storage (removable and/or non-removable) including, but not limited to, magnetic or optical disks or tape. Such additional storage is illustrated in FIG. 8 by removable storage 808 and non-removable storage 810.

Computing device 800 typically includes a variety of computer readable media. Computer readable media can be any available media that can be accessed by device 800 and includes both volatile and non-volatile media, removable and non-removable media.

Computer storage media include volatile and non-volatile, and removable and non-removable media implemented in any method or technology for storage of information such as computer readable instructions, data structures, program modules or other data. Memory 804, removable storage 808, and non-removable storage 810 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 800. Any such computer storage media may be part of computing device 800.

Computing device 800 may contain communications connection(s) 812 that allow the device to communicate with other devices. Computing device 800 may also have input device(s) 814 such as a keyboard, mouse, pen, voice input device, touch input device, etc. Output device(s) 816 such as a display, speakers, printer, etc. may also be included. All these devices are well known in the art and need not be discussed at length here.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be affected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method of location determination for a device, the method comprising:
   dividing a plurality of crowd-sourced location observations and a plurality of non-RF related factors into a training dataset and a test dataset, each of the crowd-sourced location observations including a set of base stations observed by one of a plurality of computing devices and an observation location of the device;
   assigning the crowd-sourced location observations to one or more geographic areas based on the observation locations associated with each of the crowd-sourced location observations and a location associated with each of the geographic areas;
   determining the device location estimate based on the training data set; and
   comparing the determined device location estimate to the observation location of the device corresponding to the location observation in the test dataset to calculate an accuracy value.

2. The method of claim 1, wherein the plurality of non-RF related factors comprise at least one factor from among a group of factors comprising GPS quality, device type information, client identification data, speed of the device, and the operating system utilized by the device.

3. The method of claim 1, further comprising, for the plurality of non-RF related factors, calculating a distance function between a training fingerprint and a testing fingerprint.

4. The method of claim 1, further comprising calculating an aggregate accuracy value for each of the areas based on the calculated accuracy values of the location observations assigned thereto, and wherein determining the device location estimate based on the training data set further comprises:
   determining a location model using the location observations in the training dataset; and
   for each of the location observations in the test dataset, determining a device location estimate based on the determined location model.

5. The method of claim 4, wherein dividing the plurality of crowd-sourced location observations and the plurality of non-RF related factors further comprises dividing the crowd-sourced location observations and non-RF related factors based on observation time values associated with the crowd-sourced location observations.

6. The method of claim 4, wherein comparing the determined device location estimate comprises calculating an error distance.

7. The method of claim 4, further comprising selecting a modeling algorithm, and wherein determining the location model comprises executing the selected modeling algorithm to determine the location model based on the training dataset.

8. The method of claim 4, further comprising selecting a location inference algorithm, and wherein determining the device location estimate comprises executing the selected location inference algorithm based on the determined location model.

9. A system for determining the location of a device, the system comprising:
a memory area associated with a computing device, said memory area storing location data comprising a plurality of crowd-sourced location observations and a plurality of non-RF related factors, each of the crowd-sourced location observations including a set of base stations observed by one of a plurality of mobile computing devices and an observation location of the mobile computing device, said location data including training data and test data, said memory area further storing a plurality of modeling algorithms and a plurality of location inference algorithms; and
a processor programmed to:
divide the location data into a training dataset and a test dataset;
assign the location data to one or more geographic areas based on the observation locations associated with each of the crowd-sourced location observations and a location associated with each of the geographic areas;
determine the device location estimate based on the training data set;
compare the determined device location estimate to the observation location of the device corresponding to the location observation in the test dataset to calculate an accuracy value; and
calculate an aggregate accuracy value for each of the areas based on the calculated accuracy values of the location observations assigned thereto.

10. The system of claim 9, wherein the processor is further programmed to compare the calculated aggregate accuracy values with the calculated aggregate accuracy values.

11. The system of claim 9, wherein the processor is further programmed to create models based on the training location observations.

12. The system of claim 9, wherein the processor is further programmed to compare the accuracy of different modeling algorithms and different location inference algorithms based on the aggregated accuracy values for the tiles.

13. The system of claim 9, wherein the plurality of non-RF related factors comprise at least one factor from among a group of factors comprising GPS quality, device type information, client identification data, speed of the device, and the operating system utilized by the device.

14. The system of claim 9, further comprising, for the plurality of non-RF related factors, calculating a distance function between a training fingerprint and a testing fingerprint.

15. A computer-readable storage medium having stored thereon computer readable instructions for determining the location of a device, the computer-readable instructions comprising instructions that are executable by a computer to:
construct a training data set and a test data set from location data comprising a plurality of fingerprints and a plurality of non-RF related factors;
create a model from the training data set and a distance function;
associate a plurality of tiles with the distance function incorporating the plurality of non-RF related factors; and
service an inference request corresponding to the plurality of tiles using the distance function.

16. The computer-readable storage medium of claim 15, wherein the instructions that service the inference request corresponding to the plurality of tiles using the distance function further comprise instructions that:
select a subset of fingerprints from the training set that correspond to the inference request; and
identify at least one fingerprint for a tile corresponding to the inference request based on the distance function.

17. The computer-readable storage medium of claim 15, further comprising instructions that determine an error distance curve based on the distance function and the test data.

18. The computer-readable storage medium of claim 17, further comprising instructions that determine if the error distance curve indicates either inadequate accuracy or adequate accuracy.

19. The computer-readable storage medium of claim 18, further comprising instructions that, if determined that the error distance curve indicates inadequate accuracy, fall back to another location determination methodology.

20. The computer-readable storage medium of claim 18, further comprising instructions that, if determined that the error distance curve indicates adequate accuracy, create cache data.

* * * * *